(12) United States Patent
Greenlee et al.

(10) Patent No.: US 11,342,265 B2
(45) Date of Patent: May 24, 2022

(54) APPARATUS INCLUDING A DIELECTRIC MATERIAL IN A CENTRAL PORTION OF A CONTACT VIA, AND RELATED METHODS, MEMORY DEVICES AND ELECTRONIC SYSTEMS

(71) Applicant: Micron Technology, Inc., Boise, ID (US)

(72) Inventors: Jordan D. Greenlee, Boise, ID (US); Lifang Xu, Boise, ID (US); Rita J. Klein, Boise, ID (US); Xiao Li, Boise, ID (US); Everett A. McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 16/702,222

(22) Filed: Dec. 3, 2019

(65) Prior Publication Data
US 2021/0167020 A1 Jun. 3, 2021

(51) Int. Cl.
*H01L 23/532* (2006.01)
*H01L 23/522* (2006.01)
*H01L 23/00* (2006.01)
*H01L 21/768* (2006.01)
H01L 27/11529 (2017.01)
H01L 27/11556 (2017.01)

(52) U.S. Cl.
CPC .. *H01L 23/53266* (2013.01); *H01L 21/76846* (2013.01); *H01L 23/5226* (2013.01); *H01L 23/562* (2013.01); H01L 27/11529 (2013.01); H01L 27/11556 (2013.01)

(58) Field of Classification Search
CPC ........... H01L 23/53266; H01L 23/5226; H01L 21/76846; H01L 23/562; H01L 27/11529; H01L 27/11556; H01L 21/7682; H01L 21/76847; H01L 21/76834; H01L 21/76832; H01L 21/76831; H01L 21/764; H01L 24/10; H01L 21/76882; H01L 27/11551; H01L 27/11524; H01L 27/11578; H01L 27/1157
USPC ....................................................... 257/770
See application file for complete search history.

(56) References Cited

U.S. PATENT DOCUMENTS

| | | |
|---|---|---|
| 5,847,461 A | 12/1998 | Xu et al. |
| 6,426,285 B1 | 7/2002 | Chen et al. |
| 6,740,576 B1 | 5/2004 | Lin et al. |
| 7,510,961 B2 | 3/2009 | Givens |
| 8,456,015 B2 | 6/2013 | Trezza |
| 9,040,418 B2 | 5/2015 | Farooq et al. |

(Continued)

*Primary Examiner* — Caleen O Sullivan
(74) *Attorney, Agent, or Firm* — TraskBritt (57) ABSTRACT

An apparatus comprising at least one contact structure. The at least one contact structure comprises a contact, an insulating material overlying the contact, and at least one contact via in the insulating material. The at least one contact structure also comprises a dielectric liner material adjacent the insulating material within the contact via, a conductive material adjacent the dielectric liner material, and a stress compensation material adjacent the conductive material and in a central portion of the at least one contact via. The stress compensation material is at least partially surrounded by the conductive material. Memory devices, electronic systems, and methods of forming the apparatus are also disclosed.

23 Claims, 7 Drawing Sheets (56) References Cited

U.S. PATENT DOCUMENTS

2016/0218059 A1\* 7/2016 Nakada ............. H01L 27/11582
2018/0033646 A1\* 2/2018 Sharangpani ......... H01L 21/311

\* cited by examiner

Deposition Thickness of Conductive Material (Control Sample)

FIG. 5

Deposition Thickness of Conductive Material and Stress Compensation Material

FIG. 6

APPARATUS INCLUDING A DIELECTRIC MATERIAL IN A CENTRAL PORTION OF A CONTACT VIA, AND RELATED METHODS, MEMORY DEVICES AND ELECTRONIC SYSTEMS

TECHNICAL FIELD

Embodiments disclosed herein relate to microelectronic devices and microelectronic device fabrication. More particularly, embodiments of the disclosure relate to an apparatus including a dielectric material in a central portion of a contact via, and to related memory devices and electronic systems, and to methods of forming the apparatus.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. Increasing a number of tiers of alternating dielectric materials and conductive materials is another way of increasing memory density in such memory devices and associated logic devices (e.g., control logic components) by increasing the vertical dimension (e.g., height) of the vertical memory array.

As technology advances in 3D memory devices, interconnect structures may be fabricated to minimize signal delay and to optimize packing density. Such memory devices may include one or more memory arrays, which may overlie a complementary metal-oxide-semiconductor (CMOS) region, such as CMOS under array (CUA) region. The reliability and performance of integrated circuits may be affected by the quality of their interconnect structures.

To form the memory devices according to conventional techniques, insulating material and conductive materials are deposited within openings (e.g., contact vias) and trenches of metal lines. However, the contact vias are being developed with higher aspect ratios such that obtaining adequate formation of materials within the small openings places ever increasing demands on the materials used during formation of the memory devices containing metal lines and contact vias, for example, in structures having high aspect ratios (HAR). Further, conductive contacts within the contact vias may include a metal material (e.g., tungsten) having a relatively high tensile stress (e.g., resistance of a material to deform under tension) and/or having a relatively high tensile strength (e.g., resistance of a material to break under tension). Such properties may cause misalignment and/or stress mismatch between features or structures in an array region (e.g., a memory array) and a staircase region of a memory device. For example, contact vias having a high aspect ratio may be particularly prone to distortion (e.g., bowing, bending, warping, etc.) along a height thereof. The amount of bow, in some instances, may be directly proportional to the amount of metal material deposited within the contact vias. Further, the high tensile stress properties and/or the high tensile strength properties of the conductive contacts may be additive to high tensile stress properties and/or high tensile strength properties of conductive materials found within the tiers of alternating dielectric materials and conductive materials located within the memory devices.

DETAILED DESCRIPTION

An apparatus (e.g., a microelectronic device, a semiconductor device, a memory device) is disclosed that includes a contact structure. The contact structure includes a contact, an insulating material overlying the contact, and a contact via in the insulating material. The contact structure also includes a dielectric liner material adjacent the insulating material within the contact via, a conductive material adjacent the dielectric liner material, and a stress compensation material in a central portion of the contact via. The stress compensation material may be at least partially surrounded by the conductive material. The stress compensation material may be configured to reduce distortion (e.g., bow) in a vertical direction of the contact structure. The contact structure also includes a first barrier material between the dielectric liner material and the conductive material and, optionally, a second barrier material between the conductive material and the stress compensation material. The multiple materials of the contact structure provide stress compensation to the apparatus. In some embodiments, a thickness of the dielectric liner material located adjacent the insulating material may be relatively less than a thickness of the stress compensation material located in the central portion of the contact via. Further, a thickness of the first barrier material and the second barrier material, if present, may be relatively less than a thickness of each of the stress compensation material and the dielectric liner material. Each of the conductive material, the dielectric liner material and the barrier materials of the contact structure may be formed using a conformal deposition process. The stress compensation material may be formed using a conformal deposition process or a non-conformal deposition process. The stress compensation material (e.g., a compressive material) may be formed of a material having a relatively higher compressive stress and/or a relatively higher compressive strength than that of the conductive material. The stress compensation material may substantially inhibit (e.g., impede, prevent) the occurrence of so-called "bow" within the apparatus. The high compressive stress and/or the high compressive strength of the stress compensation material may be used to balance (e.g., offset) high tensile stress properties and/or high tensile strength properties of the conductive material within the contact via in order to reduce (e.g., minimize) bow within the apparatus including the contact structure. The apparatus including the contact structure according to embodiments of the disclosure exhibits improved structural properties compared to conventional apparatuses lacking the stress compensation material in a central portion of the contact via.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional fabrication techniques employed in the semiconductor industry. In addition, the description provided below does not form a complete process flow for manufacturing an apparatus. The structures described below do not form a complete microelectronic device. Only those process stages (e.g., acts) and structures necessary to understand the embodiments of the disclosure are described in detail below. Additional stages to form a complete microelectronic device may be performed by conventional fabrication techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, orientation, and arrangement of one or more of at least one structure and at least one apparatus facilitating operation of one or more of the structure and the apparatus in a pre-determined way.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "apparatus" includes without limitation a memory device, as well as other microelectronic devices (e.g., semiconductor devices) which may or may not incorporate memory, such as a logic device, a processor device, or a radiofrequency (RF) device. Further, the apparatus may incorporate memory in addition to other functions such as, for example, a so-called "system on a chip" (SoC) including a processor and memory, or an apparatus including logic and memory. The apparatus may be a 3D microelectronic device including, but not limited to, a 3D NAND Flash memory device, such as a 3D floating gate NAND Flash memory device or a 3D replacement gate NAND Flash memory device.

As used herein, the term "stress compensation material" means and includes a material having a relatively high compressive stress and configured to substantially inhibit (e.g., substantially reduce, substantially prevent) the occurrence of distortion (e.g., bow) of an adjacent material.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1I are simplified partial cross-sectional views and top down views illustrating embodiments of a method of forming an apparatus (e.g., a microelectronic device) including contact structures (e.g., electrically conductive structures) at various stages of the method. For simplicity, the formation of a single contact structure is illustrated, but it will be understood by one of ordinary skill in the art that the method includes forming multiple (e.g., more than one, an array of) apparatuses including such contact structures. With the description provided below, it will be readily apparent to one of ordinary skill in the art that the methods described herein may be used in fabrication of various apparatus. In other words, the methods of the disclosure may be used whenever it is desired to form the apparatus.

Figure 1A:
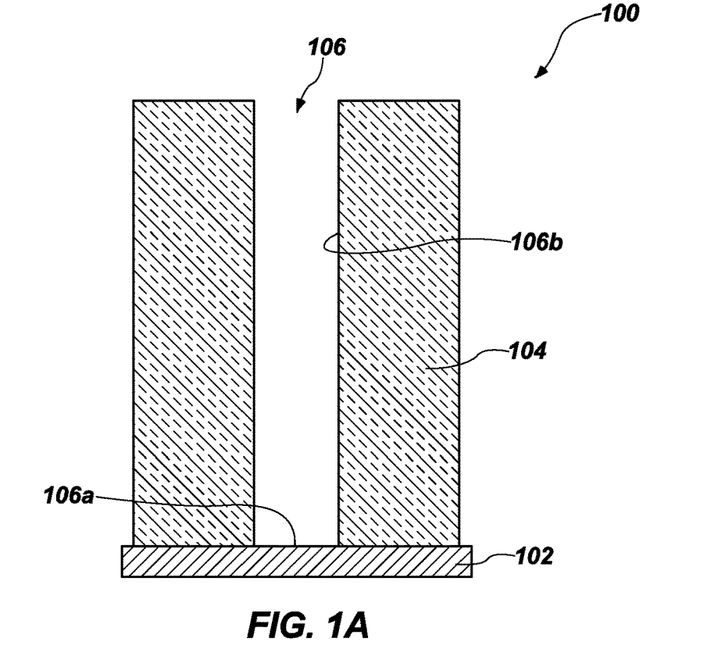
FIGS. 1A through 1F are simplified, partial cross-sectional views illustrating various stages of forming an apparatus including a contact structure, in accordance with embodiments of the disclosure.

Referring to FIG. 1A, a partially fabricated contact structure 100 for use in an apparatus (e.g., a microelectronic device, a memory device) is shown. The contact structure 100 includes a contact 102 and an insulating material 104 overlying at least a portion of the contact 102. In some embodiments, the insulating material 104 may include a single insulative material (e.g., a dielectric material). In other embodiments, the insulating material 104 may include a stack of alternating materials. For example, the stack of alternating materials may include alternating tiers of a first dielectric material and a second dielectric material that differ from one another. At least some of the alternating tiers of the dielectric materials of the insulating material 104 may have been replaced with a conductive material prior to forming the contact structure 100. As shown in FIG. 1A, portions of the insulating material 104 are selectively removed to form openings 106 (e.g., vias, contact vias) having a bottom surface 106a and side surfaces 106b (e.g., sidewalls) corresponding to locations where the contact structures 100 are ultimately to be formed. The openings 106 traverse the insulating material 104 and extend from an upper surface of the insulating material 104 to an upper surface of the contact 102. The openings 106 may be formed in the insulating material 104 by conventional techniques, such as by removing portions of the insulating material 104 by dry etching or wet etching, for example. The openings 106 may be defined by the side surfaces 106b and the bottom surface 106a thereof within the insulating material 104. The openings 106 may be high aspect ratio (HAR) openings, such as having an aspect ratio of at least about 20:1, at least about 40:1, at least about 50:1, at least about 60:1, at least about 80:1, or at least about 100:1. In some embodiments, the openings 106 may have an aspect ratio of between about 20:1 and about 40:1.

Figure 1B:
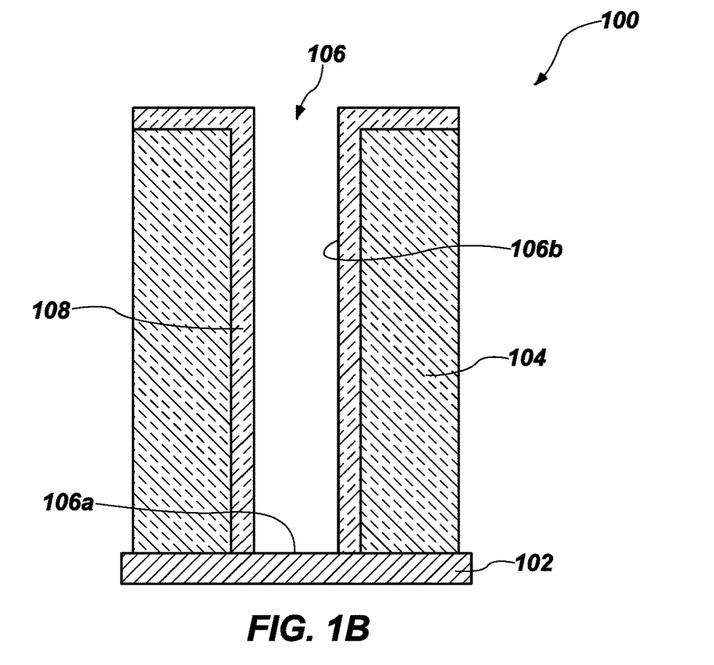

Referring next to FIG. 1B, a dielectric liner material 108 may be formed within the openings 106 and over exposed upper surfaces and side surfaces of the insulating material 104. In particular, the dielectric liner material 108 may be conformally formed on the bottom surface 106a and on the side surfaces 106b of the openings 106 and on upper surfaces of the insulating material 104 adjacent to (e.g., located outside of) the openings 106. The dielectric liner material 108 may initially be formed over an exposed upper surface of the contact 102, which is subsequently removed from the upper surface of the contact 102 using one or more conventional removal processes, such as one or more so called "punch etch" processes. As shown in FIG. 1B, the dielectric liner material 108 substantially covers exposed surfaces of the insulating material 104. The dielectric liner material 108 may be formed to exhibit any desirable thickness. By way of non-limiting example, the dielectric liner material 108 may be formed to a thickness of between about 50 Å (Angstroms) and about 150 Å, such as between about 50 Å and about 75 Å, between about 75 Å and about 100 Å, between about 100 Å and about 125 Å, or between about 125 Å and about 150 Å. The thickness of the dielectric liner material 108 may be substantially uniform along its length.

The dielectric liner material 108 may be formed of and include, but is not limited to, an oxide (e.g., silicon dioxide ($SiO_2$)), a nitride (e.g., silicon nitride (SiN)), or an oxynitride. In some embodiments, the dielectric liner material 108 is a high quality silicon oxide material, such as an ALD $SiO_x$. For example, the dielectric liner material 108 may be a highly uniform and highly conformal silicon oxide material (e.g., a highly uniform and highly conformal silicon dioxide material). The dielectric liner material 108 may be highly uniform and highly conformal as deposited.

The dielectric liner material 108 may be formed using one or more conventional conformal deposition techniques, including, but not limited to one or more of a conventional CVD process or a conventional ALD process. The dielectric liner material 108 may form a substantially continuous material over the insulating material 104. The dielectric liner material 108 may facilitate (e.g., improve) adhesion of subsequent materials to the insulating material 104.

Figure 1C:
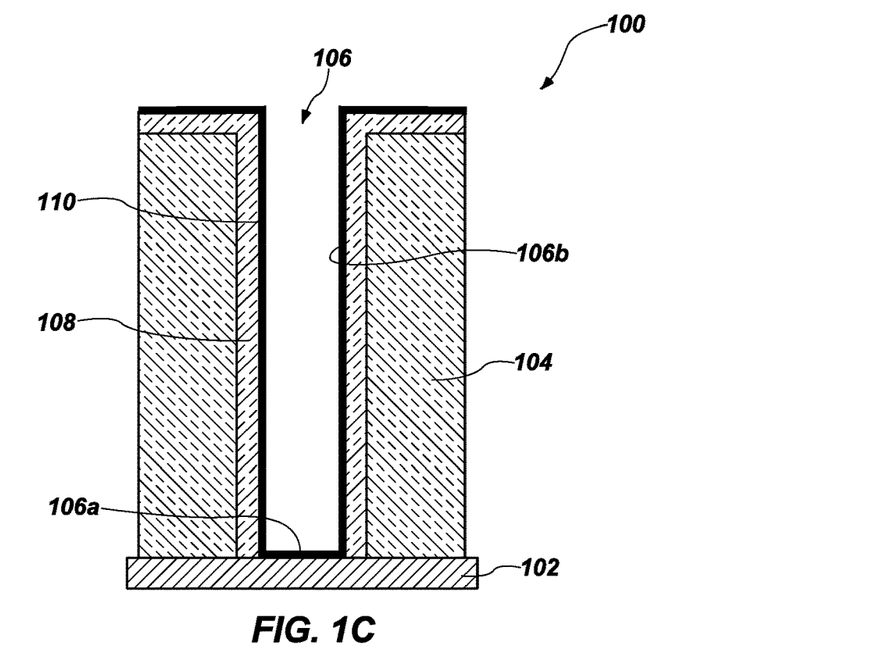

Referring to FIG. 1C, a first barrier material 110 may, optionally, be formed adjacent to (e.g., on or over) surfaces of the dielectric liner material 108 and the contact 102. For example, the first barrier material 110 may be conformally formed on exposed side surfaces and exposed upper surfaces of the dielectric liner material 108 and may at least partially (e.g., substantially) cover the exposed upper surface of the contact 102. In other words, the first barrier material 110 may be formed on the bottom surface 106a and on the side surfaces 106b of the openings 106 and on exposed upper surfaces of the dielectric liner material 108 adjacent to (e.g., located outside of) the openings 106. The first barrier material 110 may be formed at any desirable thickness. By way of non-limiting example, the first barrier material 110 may be formed to a thickness of between about 15 Å and about 100 Å, such as between about 15 Å and about 35 Å, between about 35 Å and about 65 Å, or between about 65 Å and about 100 Å. In some embodiments, the first barrier material 110 may be formed to a thickness of about 50 Å. The thickness of the first barrier material 110 may be substantially uniform along its length. However, in some embodiments, the first barrier material 110 may not be present.

The first barrier material 110 may be formed of and include at least one dielectric material and/or at least one conductive material. By way of non-limiting example, the first barrier material 110 may be formed of and include at least one dielectric material substantially free of oxygen, such as one or more of a dielectric nitride material (e.g., silicon nitride ($Si_xN_y$), titanium nitride ($TiN_y$), boron nitride ($BN_y$), germanium nitride ($GeN_y$), aluminum nitride ($AlN_y$)) and a dielectric carbonitride material (e.g., silicon carbonitride ($SiC_zN_y$)), where each of x, y, z is independently an integer or a non-integer. The first barrier material 110 may be a binary or multinary (e.g., ternary) compound. In some embodiments, the first barrier material 110 is formed of and includes $Si_xN_y$ (e.g., $Si_3N_4$). In other embodiments, the first barrier material 110 may be formed of and include an oxynitride material including, but not limited to, silicon oxynitride ($SiO_xN_y$), boron oxynitride ($BO_xN_y$), germanium oxynitride ($GeO_xN_y$), and aluminum oxynitride ($AlO_xN_y$).

The first barrier material 110 may be formed using one or more conventional conformal deposition techniques, such as one or more of a conventional ALD process or a conventional conformal CVD process. The first barrier material 110 may reduce (e.g., minimize) oxidation of subsequent materials (e.g., conductive materials). In some embodiments, portions of the first barrier material 110 may be subsequently removed. For example, the first barrier material 110 may be removed from the upper surface of the contact 102 using one or more conventional removal processes, such as one or more punch etch processes, in embodiments where the first barrier material 110 includes a dielectric material. The first barrier material 110 may be removed during the same removal process as that of the dielectric liner material 108 or, alternatively, the first barrier material 110 may be removed in a separate removal process.

Figure 1D:
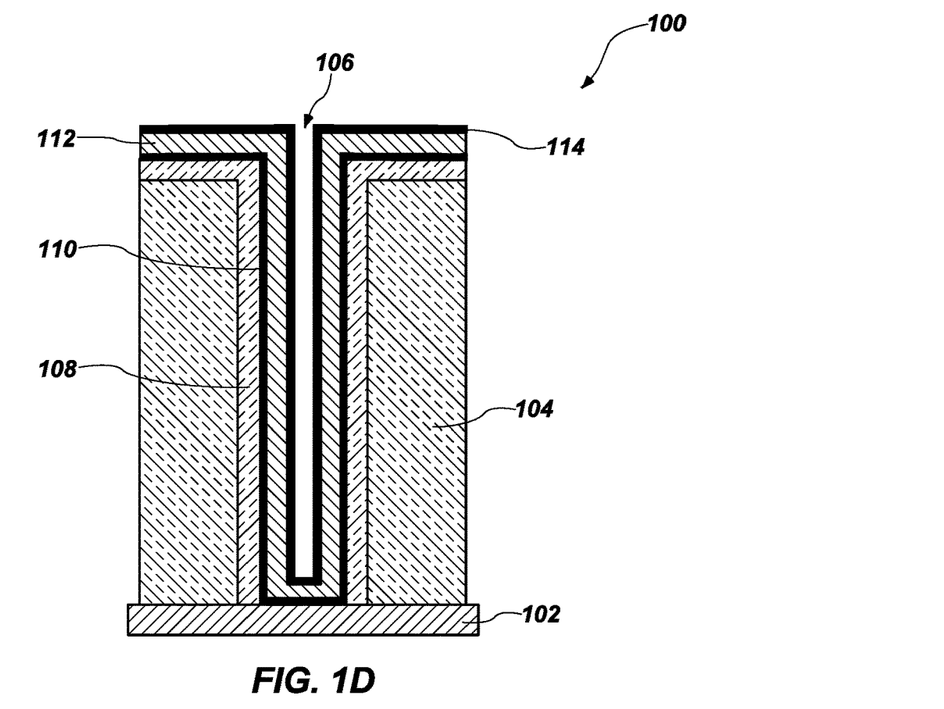

Referring next to FIG. 1D, a conductive material 112 may be formed adjacent to (e.g., on or over) surfaces of the first barrier material 110. For example, the conductive material 112 may be conformally formed on exposed side surfaces and exposed upper surfaces of the first barrier material 110 within the openings 106 and on exposed upper surfaces of the first barrier material 110 adjacent to (e.g., located outside of) the openings 106. Since the conductive material 112 is conformally formed, a portion of the openings 106 may remain substantially free of the conductive material 112. Therefore, the conductive material 112 is formed in the openings 106 without fully filling the openings 106. In such embodiments, the conductive material 112 may be formed immediately adjacent surfaces of the dielectric liner material 108 and may at least partially (e.g., substantially) cover the exposed surface of the contact 102 without fully filling a remaining portion (e.g., a central portion) of the openings 106. In other words, the conductive material 112 may be in direct physical contact with the dielectric liner material 108 and the contact 102, in some embodiments. In other embodiments, the conductive material 112 is in electrical contact with the contact 102 without being in direct physical contact therewith. The conductive material 112 may be formed at any desirable thickness. By way of non-limiting example, the conductive material 112 may be formed to a thickness of between about 50 Å and about 500 Å, such as between about 50 Å and about 100 Å, between about 100 Å and about 200 Å, between about 200 Å and about 300 Å, or between about 300 Å and about 500 Å, in some embodiments. In other embodiments, the conductive material 112 may be formed to a thickness of between about 500 Å and about 2500 Å, such as between about 500 Å and about 1000 Å, between about 1000 Å and about 2000 Å, or between about 2000 Å and about 2500 Å, for example. A person of ordinary skill in the art will understand that the thicknesses of the conductive material 112 may depend, at least in part, on the type of material used. The thickness of the conductive material 112 may be substantially uniform along its length.

The conductive material 112 may be formed of and include at least one electrically conductive material. By way of non-limiting example, the conductive material 112 may be a metal material (e.g., a transition metal material) or a metal nitride material (e.g., a transition metal nitride material), such as one or more of titanium nitride ($TiN_y$), tungsten (W), tungsten nitride ($WN_y$), tantalum nitride ($TaN_y$), Cobalt (Co), molybdenum nitride ($MoN_y$), or ruthenium (Ru), where y is independently an integer or a non-integer. In some embodiments, the conductive material 112 comprises a titanium nitride $TiN_y$, such as TiN. In other embodiments, the conductive material 112 comprises tungsten (W). In yet other embodiments, the conductive material 112 comprises ruthenium (Ru).

The conductive material 112 may be formed using one or more conventional conformal deposition techniques, such as one or more of a conventional ALD process or a conventional conformal CVD process.

With continued reference to FIG. 1D, a second barrier material 114 may, optionally, be formed adjacent to (e.g., on or over) surfaces of the conductive material 112. For example, the second barrier material 114, if present, may be conformally formed on exposed side surfaces and exposed upper surfaces of the conductive material 112 within the openings 106 and on exposed upper surfaces of the conductive material 112 adjacent to (e.g., located outside of) the openings 106. The second barrier material 114 may be formed at a thickness such that the remaining portion (e.g., the central portion) of the openings 106 remains substantially free of the second barrier material 114. The second barrier material 114 may be formed at any desirable thickness. By way of non-limiting example, the second barrier material 114 may be formed to a thickness of between about 15 Å and about 100 Å, such as between about 15 Å and about 35 Å, between about 35 Å and about 65 Å, or between about 65 Å and about 100 Å. In some embodiments, the second barrier material 114 may be formed to a thickness of about 50 Å. The thickness of the second barrier material 114 may be substantially uniform along its length. In addition, the thickness of the second barrier material 114 may be the same as, or different than, the thickness of the first barrier material 110 located between the dielectric liner material 108 and the conductive material 112.

The second barrier material 114 may be formed of and include at least one dielectric material and/or at least one conductive material. By way of non-limiting example, the second barrier material 114 may be formed of and include at least one dielectric material substantially free of oxygen, such as one or more of a dielectric nitride material (e.g., silicon nitride ($Si_xN_y$), titanium nitride ($TiN_y$), boron nitride ($BN_y$), germanium nitride ($GeN_y$), aluminum nitride ($AlN_y$)) and a dielectric carbonitride material (e.g., silicon carbonitride ($SiC_zN_y$)), where each of x, y, z is independently an integer or a non-integer. The second barrier material 114 may be a binary or multinary (e.g., ternary) compound. In some embodiments, the second barrier material 114 is formed of and includes $Si_xN_y$ (e.g., $Si_3N_4$). In other embodiments, the second barrier material 114 may be formed of and include an oxynitride material including, but not limited to, silicon oxynitride ($SiO_xN_y$), boron oxynitride ($BO_xN_y$), germanium oxynitride ($GeO_xN_y$), and aluminum oxynitride ($AlO_xN_y$). In addition, the material of the second barrier material 114 may be the same as, or different than, the material of the first barrier material 110.

If present, the second barrier material 114 may be formed using one or more conventional conformal deposition techniques, such as one or more of a conventional ALD process or a conventional conformal CVD process. For clarity and convenience, the second barrier material 114 has been removed from the partial cross-sectional and top down views of subsequent FIGS. 1E through 1I, although it is to be understood that the second barrier material 114 may, optionally, be included in a fully assembled contact structure 100.

Figure 1E:
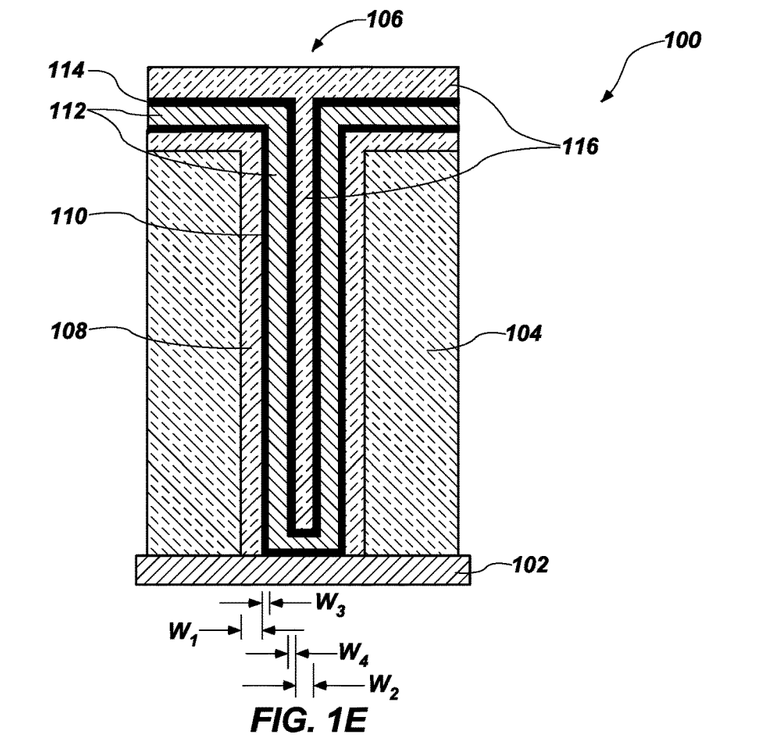

Referring next to FIG. 1E, a stress compensation material 116 may be formed adjacent to (e.g., on or over) surfaces of the second barrier material 114, if present, or, alternatively, adjacent to (e.g., on or over) surfaces of the conductive material 112. As shown in FIG. 1E, the stress compensation material 116 may at least partially (e.g., substantially) cover upper surfaces of the conductive material 112 and extend from and between side surfaces (e.g., sidewalls) of the conductive material 112 as well as over the horizontal surfaces of the conductive material 112. In other words, the stress compensation material 116 may substantially fill the remainder of the openings 106 and also form over the horizontal surfaces of the conductive material 112. The stress compensation material 116 may be formed in the central portion of the openings 106. In other words, the stress compensation material 116 may substantially completely fill the central portion of the openings 106. Therefore, the central portion of the openings 106 may contain the stress compensation material 116 and may be substantially entirely free of the conductive material 112. In some embodiments, the stress compensation material 116 may be immediately adjacent to (e.g., in direct physical contact with) the conductive material 112. In other embodiments, the second barrier material 114 may intervene between the stress compensation material 116 and the conductive material 112. The stress compensation material 116 may be located distal to the dielectric liner material 108 with one or more materials (e.g., the conductive material 112) intervening therebetween. The stress compensation material 116 may be formed to exhibit any desirable thickness. By way of non-limiting example, the stress compensation material 116 may be formed to a thickness of between about 50 Å and about 10,000 Å, such as between about 50 Å and about 500 Å, between about 500 Å and about 1000 Å, between about 1000 Å and about 2000 Å, between about 2000 Å and about 3000 Å, between about 3000 Å and about 5000 Å, or between about 5000 Å and about 10,000 Å. In some embodiments, the stress compensation material 116 may be formed to a thickness of about 2500 Å (e.g., about 0.25 μm). An average thickness (e.g., width $W_1$) of the dielectric liner material 108 may be relatively less than an average thickness (e.g., width $W_2$) of the stress compensation material 116, as shown in FIG. 1E. In addition, the thickness (e.g., average thickness) of each of the first barrier material 110 (e.g., width $W_3$) and the second barrier material 114 (e.g., width $W_4$), if present, may be relatively less than the thickness (e.g., average thickness) of each of the dielectric liner material 108 and the stress compensation material 116. Further, the thickness (e.g., average thickness) of the conductive material 112 may be relatively less than the average thickness of the stress compensation material 116.

As shown in FIG. 1E, the conductive material 112 may substantially surround (e.g., substantially continuously surround) the stress compensation material 116 on at least three (3) sides. In other words, the conductive material 112 may substantially completely cover the bottom surface and side surfaces (e.g., sidewalls) of the stress compensation material 116. The second barrier material 114, if present, may horizontally intervene between the side surfaces of the stress compensation material 116 and side surfaces of the conductive material 112 and may vertically intervene between the bottom surface of the stress compensation material 116 and the upper surface of the conductive material 112. The stress compensation material 116, which exhibits a relatively high compressive stress and/or a relatively high compressive strength, may function as a structural support within the contact structure 100 and balance (e.g., offset) the relatively high tensile stress and/or the relatively high tensile strength properties of the conductive material 112 in order to reduce distortion (e.g., bowing, bending, warping, etc.) of the contact structure 100. In other words, the stress compensation material 116 may be configured to substantially inhibit (e.g., impede, prevent) the occurrence of so-called "bowing" of the contact structure 100. Without the stress compensation material being present in the central portion of the openings 106 in an insulating material, bowing in a vertical direction of the contact structure may occur due to the relatively high tensile stress and/or the relatively high tensile strength properties of a conductive material within the openings 106 in the insulating material.

By way of non-limiting example, the stress compensation material 116 may include a stress compensation material (e.g., a high compressive stress material) having a compressive stress of between about 50 MPa and about 500 MPa, such as between about 50 MPa and about 100 MPa, between about 100 MPa and about 200 MPa, between about 200 MPa and about 300 MPa, or between about 300 MPa and about 500 MPa. Relative thicknesses of the conductive material 112 and the stress compensation material 116 may be tailored (e.g., selected) to meet design criteria of specific electronic devices such that the stress compensation material (e.g., a compressive oxide material) of the stress compensation material 116 offsets the high tensile stress properties of the conductive material 112 to reduce bow by a predetermined amount (e.g., percentage). By way of non-limiting example, a percentage of bow reduction of the contact structure 100 may be between about 15 percent and about 400 percent of an initial (e.g., expected) amount of bow, such as between about 25 percent and about 75 percent, between about 75 percent and about 100 percent, between about 100 percent and about 200 percent, or between about 200 percent and about 400 percent. One of ordinary skill in the art will understand that selective placement (e.g., thicknesses) of materials as well as formation of such materials, including types of materials, processing conditions (e.g., temperature) and the like, may be selected to achieve the desired performance requirements while minimizing undesirable levels of resistivity, which variables may be optimized (e.g., tuned) to achieve improved structural properties.

The stress compensation material 116 may be formed of and include, but is not limited to, an oxide (e.g., silicon dioxide ($SiO_2$)), a nitride (e.g., silicon nitride (SiN)), or an oxynitride. The stress compensation material 116 may be formed of the stress compensation material, such as a compressive dielectric (e.g., oxide) material. In some embodiments, the stress compensation material 116 is a high quality silicon oxide material, such as an ALD $SiO_x$. For example, the stress compensation material 116 may be a highly uniform and highly conformal silicon oxide material (e.g., a highly uniform and highly conformal silicon dioxide material) so that voids are not present in the central portion. The stress compensation material 116 may be highly uniform and highly conformal as deposited. In particular, the stress compensation material 116 may be formulated to be formed in high aspect ratio (HAR) openings, such as the openings 106, without forming voids. In addition, the material of the stress compensation material 116 may be the same as, or different than, the material of the dielectric liner material 108. In other embodiments, the stress compensation material 116 may be formed of and include at least one conductive material, such as a compressive conductive material having a relatively higher compressive stress than that of the conductive material 112.

The stress compensation material 116 may be formed using one or more conventional conformal deposition processes, such as one or more of a conventional conformal CVD process or a conventional ALD process. Alternatively, the stress compensation material 116 may be formed using one or more conventional non-conformal deposition processes, such as one or more of a conventional PVD process (e.g., a conventional radio frequency PVD (RFPVD) process), or a conventional non-conformal CVD process.

Figure 1F:
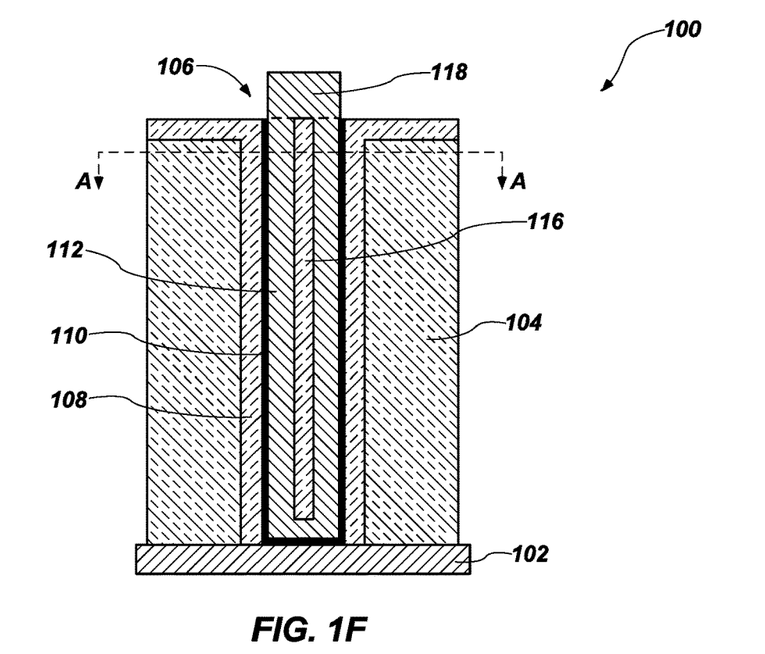

Referring next to FIG. 1F, one or more removal processes may be conducted to remove portions of the first barrier material 110, the conductive material 112, the second barrier material 114, if present, and the stress compensation material 116 extending over the openings 106 and over the upper surfaces of the insulating material 104 (e.g., over an exposed upper surface of the dielectric liner material 108) external to the openings 106, as shown in FIG. 1F. In particular, upper portions of each of the first barrier material 110, the conductive material 112, the second barrier material 114, and the stress compensation material 116 may be removed by conventional techniques, such that upper surfaces of each of the materials are substantially coplanar with one another and with remaining portions of the dielectric liner material 108 above the insulating material 104. In particular, the stress compensation material 116 may extend vertically in the openings 106 with a lower end of the stress compensation material 116 being below an upper surface of the insulating material 104 and an upper end of the stress compensation material 116 being substantially coplanar with an upper surface of the dielectric liner material 108. Following the removal process, upper surfaces of the dielectric liner material 108, the first barrier material 110, the conductive material 112, the second barrier material 114, if present, and the stress compensation material 116 may be exposed at a top end of the openings 106. By way of example only, one or more dry etch processes or wet etch processes may be conducted to remove the portions of the dielectric liner material 108, the first barrier material 110, the conductive material 112, the second barrier material 114, and the stress compensation material 116. Alternatively, the materials may be subjected to at least one conventional planarization process (e.g., at least one conventional CMP process) to facilitate or enhance the planarity of an upper boundary (e.g., upper surface) of each of the materials for further processing thereon.

With continued reference to FIG. 1F, an upper conductive structure 118 (e.g., one or more electrically conductive structures) may be formed over the upper surfaces of at least some of the materials exposed at the top end of the openings 106. As shown in FIG. 1F, the upper conductive structure 118 may be formed adjacent to (e.g., on or over) portions of each of the conductive material 112 and the stress compensation material 116, for example, and may vertically extend above upper surfaces thereof. The upper conductive structure 118 may also overlay upper surfaces of one or more of the insulating material 104, the dielectric liner material 108, the first barrier material 110, and/or the second barrier material 114.

The upper conductive structure 118 may be formed of and include at least one electrically conductive material, such as one or more of a metal, an alloy, a conductive metal oxide, a conductive metal nitride, a conductive metal silicide, and a conductively doped semiconductor material. By way of non-limiting example, the upper conductive structure 118 may be formed of and include one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), and conductively doped silicon. In some embodiments, the upper conductive structure 118 is formed of and includes tungsten (W). The upper conductive structure 118 may be formed and patterned by conventional techniques.

Figure 1G:
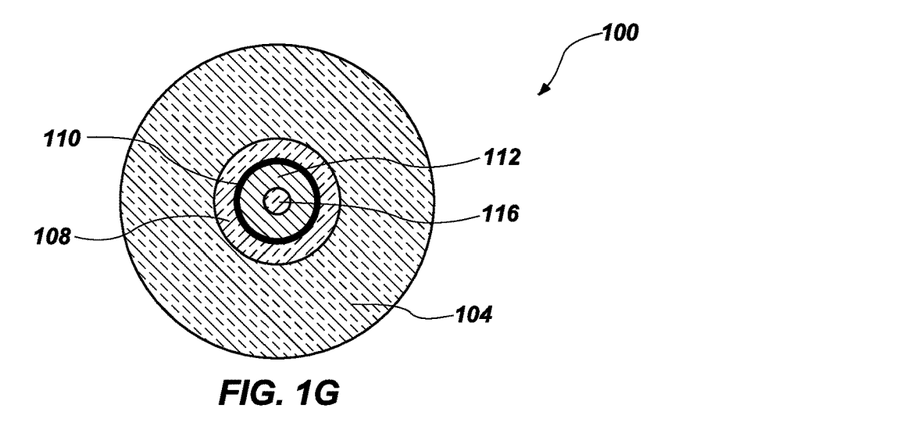
FIG. 1G is a simplified, top down view of the apparatus of FIG. 1F, in accordance with embodiments of the disclosure, where the top down view of FIG. 1G is taken along section line A-A of the partial cross-sectional view of FIG. 1F.

The placement of the upper conductive structure 118 may depend, at least in part, upon the extent (e.g., size, location, etc.) of the exposed conductive material 112 and/or the exposed stress compensation material 116 within the openings 106. In particular, sizes (e.g., widths, diameters) of each of the conductive material 112 and the stress compensation material 116 may be varied, as shown in FIG. 1G, where the top down view of FIG. 1G is taken along section line A-A of the partial cross-sectional view of FIG. 1F. As shown in FIG. 1G in combination with FIG. 1F, at least a portion of the upper conductive structure 118 may be adjacent to (e.g., directly vertically overlay) the conductive material 112. In other words, the upper conductive structure 118 may be formed (e.g., positioned) to allow electrical connection with the conductive material 112. Since the stress compensation material 116 is formed within the central portion of the openings 106, subsequent conductive structures, such as the upper conductive structure 118, may be positioned such that electrical contact is made with the underlying conductive material 112. For example, the upper conductive structure 118 may be formed at a sufficient width to overlay at least a portion of the conductive material 112, in some embodiments. In other embodiments, the upper conductive structure 118 may substantially overlay an entire portion of the conductive material 112. The upper conductive structure 118 may, for example, be laterally offset (e.g., positioned off-center or staggered) in order to facilitate electrical connection with the conductive material 112. While the upper conductive structure 118 is shown, for illustrative purposes, as a discrete structure overlying the openings 106 of the contact structure 100, one of ordinary skill in the art will understand that the upper conductive structure 118 may be one of and/or a portion of additional structures overlying materials of the contact structure 100.

Figure 1H:
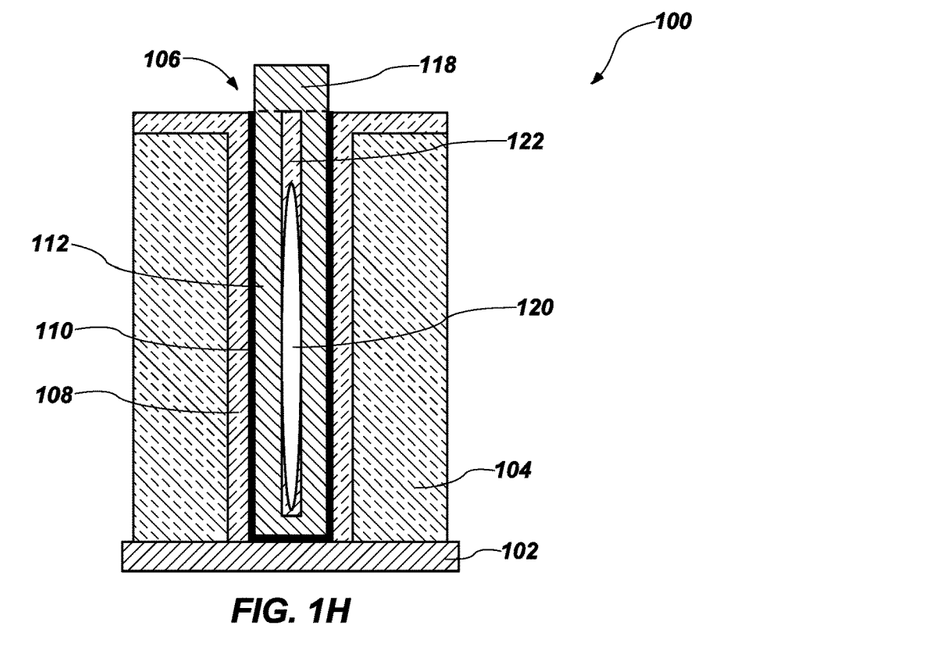
FIG. 1H is a simplified, partial cross-sectional view of the apparatus of FIG. 1F, in accordance with another embodiment of the disclosure.

Referring next to FIG. 1H, one or more air gaps 120 (e.g., void spaces) may be formed within the central portion of the openings 106, in some embodiments, instead of forming the stress compensation material 116 in the openings 106. A cap material 122 may be formed proximate a top end of the openings 106 to seal unfilled spaces in a central portion therein to form the air gaps 120. The air gaps 120 may vertically extend from a location vertically above the contact 102 and may laterally intervene between portions of the conductive material 112. In particular, the air gaps 120 may be formed in the central portion of the openings 106 following formation of the conductive material 112, as shown in FIG. 1H. In some instances, the air gaps 120 may serve as an insulator having a dielectric constant (k) of about 1. Further, the air gaps 120 may improve the stability of the contact structure 100 by providing structural support within the unfilled central portion of the openings 106, through stress and/or strain relaxation. In some embodiments, the stress compensation material 116 (FIG. 1F) may be replaced (e.g., substantially entirely replaced) with or, alternatively, supplemented with the air gaps 120 and the cap material 122.

The cap material 122 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xC_zN_y$), and amorphous carbon. In some embodiments, the cap material 122 comprises $SiO_2$. Further, the material of the cap material 122 may be the same as, or different than, the material of the dielectric liner material 108 and/or the stress compensation material 116.

The cap material 122 may be formed using conventional processes (e.g., conventional deposition processes, conventional material removal processes) and conventional processing equipment, which are not described in detail herein. For example, the cap material 122 may be formed on or over portions of the exposed surfaces of the conductive material 112 using one or more conventional non-conformal deposition processes (e.g., at least one conventional non-conformal PVD process). Thereafter, the cap material 122 may be subjected to at least one conventional planarization process (e.g., at least one conventional CMP process) to facilitate or enhance the planarity of an upper boundary (e.g., upper surface) of the cap material 122. As shown in FIG. 1H, the upper conductive structure 118 may be formed adjacent to (e.g., on or over) portions of each of the conductive material 112 and the cap material 122. Further, the upper conductive structure 118 may be positioned such that electrical contact is made with the underlying conductive material 112, as discussed in greater detail with reference to FIG. 1F.

The contact structure 100 including the conductive material 112 and the stress compensation material 116, as shown in FIG. 1F, and/or the air gaps 120 and the cap material 122, as shown in FIG. 1H, provides improved structural characteristics to an apparatus including the contact structure 100. To complete formation of an apparatus including the contact structure 100, which includes the conductive material 112 and the stress compensation material 116 and/or the air gaps 120 and the cap material 122, additional materials may be formed thereover by conventional techniques, which are not described in detail herein. Without being bound by any theory, it is believed that the stress compensation material 116 functions to impede (e.g., inhibit, prevent) undesirable distortion (e.g., bow) within the contact structure 100 according to embodiments of the disclosure. Without being bound to any theory, it is believed that the stress compensation material 116 reduces misalignment and/or stress mismatch between features or structures of the electronic device by lowering the likelihood for the electronic device to experience undesirable bowing in a vertical direction (e.g., height, depth) of the contact structure 100. In other words, the stress compensation material 116, which has the relatively high compressive stress, may be used to balance (e.g., offset) the relatively high tensile stress properties of the conductive material 112 to reduce (e.g., minimize) bow within the contact structure 100. The stress compensation material 116 within the central portion of the openings 106 of the contact structure 100 according to embodiments of the disclosure was determined to improve the structural properties of the electronic device as well as increase its alignment using a stress compensation material to offset the tensile stress properties of the conductive material 112.

Figure 1I:
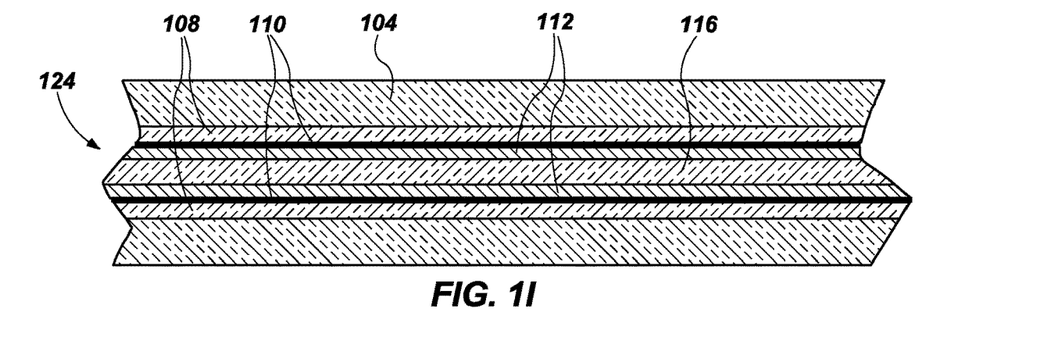
FIG. 1I is a simplified, top down view of the apparatus, in accordance with another embodiment of the disclosure.

In additional embodiments, the stress compensation material 116 may also be formed within other (e.g., adjacent) structures associated with the apparatus. As illustrated in FIG. 1I, trenches 124 may be formed in the insulating material 104 and may extend between at least some of the openings 106 of the contact structure 100 (FIG. 1F). In some embodiments, the trenches 124, for example, may include materials similar to (e.g., the same as) materials formed within the openings 106. In other words, the trenches 124 may intersect the openings 106 (e.g., contact vias) with at least some of the trenches 124 including one or more of the dielectric liner material 108, the first barrier material 110, the conductive material 112, the second barrier material 114, and/or the stress compensation material 116. In some embodiments, at least some of the trenches 124 may include the stress compensation material 116 in a central portion thereof, the conductive material 112 adjacent to and at least partially surrounding the stress compensation material 116, the first barrier material 110 adjacent the conductive material 112, and the dielectric liner material 108 adjacent the first barrier material 110, as shown in FIG. 1I. In some instances, the materials may be formed in the trenches 124 prior to or, alternatively, subsequent to formation of the materials within the openings 106. In other embodiments, at least some of the materials (e.g., the conductive material 112 and/or the stress compensation material 116) may be formed substantially simultaneously in the openings 106 and the trenches 124 in order to simplify manufacturing processes.

The stress compensation material 116 may be formed to exhibit any desirable thickness (e.g., width) and length within the trenches 124. By way of non-limiting example, the stress compensation material 116 may be formed within the trenches 124 to a thickness of between about 50 Å and about 10,000 Å, such as between about 50 Å and about 100 Å, between about 100 Å and about 200 Å, between about 200 Å and about 250 Å, between about 250 Å and about 300 Å, between about 300 Å and about 500 Å, between about 500 Å and about 1000 Å, between about 1000 Å and about 3000 Å, between about 3000 Å and about 5000 Å, or between about 5000 Å and about 10,000 Å. In some embodiments, the stress compensation material 116 may be formed to a thickness of between about 270 Å and about 290 Å (e.g., between about 27 nm and about 29 nm). In addition, the stress compensation material 116 may be formed to a length of between about 0.25 μm and about 2 μm associated with various lengths of respective portions of the trenches 124 extending between the openings 106. Further, thicknesses of the materials located in the trenches 124 may be the same as, or different than, the thicknesses of the materials located in the openings 106. For example, a thickness of the stress compensation material 116 may be relatively greater within the trenches 124 than within the openings 106, in some embodiments. In other embodiments, a thickness of the stress compensation material 116 may be relatively less within the trenches 124 than within the openings 106, and a thickness of the conductive material 112 may be relatively greater within the trenches 124 than within the openings 106. In other words, the trenches 124 may include a relatively greater amount of the conductive material 112 than that of the openings 106 in order to facilitate electrical connections within the trenches 124. Formation of the stress compensation material 116 within the trenches 124 may improve the stability of the contact structure 100 by providing structural support using the relatively high compressive stress material of the stress compensation material 116 to offset the relatively high tensile stress of the conductive material 112 within the trenches 124 without significantly reducing conductivity.

Accordingly, an apparatus comprising at least one contact structure is disclosed. The at least one contact structure comprises a contact, an insulating material overlying the contact, and at least one contact via in the insulating material. The at least one contact structure also comprises a dielectric liner material adjacent the insulating material within the contact via, a conductive material adjacent the dielectric liner material, and a stress compensation material adjacent the conductive material and in a central portion of the at least one contact via. The stress compensation material is at least partially surrounded by the conductive material.

Aspects (e.g., processing stages and structures) of the methods described above with reference to FIGS. 1A through 1I may be employed in additional methods of forming an apparatus to facilitate one or more benefits (e.g., at least some of the benefits effectuated by the methods previously described with reference to FIGS. 1A through 1I, and/or additional benefits) as compared to conventional methods and conventional apparatuses. The methods of the disclosure may reduce or eliminate processes utilized to form many conventional apparatuses that may be used for similar operations as the contact structure 100. For example, relative thicknesses of the conductive material 112 and the stress compensation material 116 may be tailored (e.g., selected) to meet design criteria of specific apparatuses such that the stress compensation material (e.g., a compressive material) of the stress compensation material 116 may be used to offset the tensile stress properties of the conductive material 112 in order to properly position subsequently formed structures within the apparatus at desired locations to enhance proper alignment between adjacent structures (e.g., electrical connections).

Accordingly, a method of forming an apparatus is also disclosed. The method comprises forming a dielectric liner material within an opening in an insulating material, forming a barrier material adjacent to the dielectric liner material, forming a conductive material adjacent to the barrier material, and forming a stress compensation material in a central portion of the opening and adjacent to the conductive material. The conductive material is in electrical contact with a contact underlying the insulating material. The stress compensation material is configured to reduce bow in a vertical direction of the opening in the insulating material.

Figure 2:
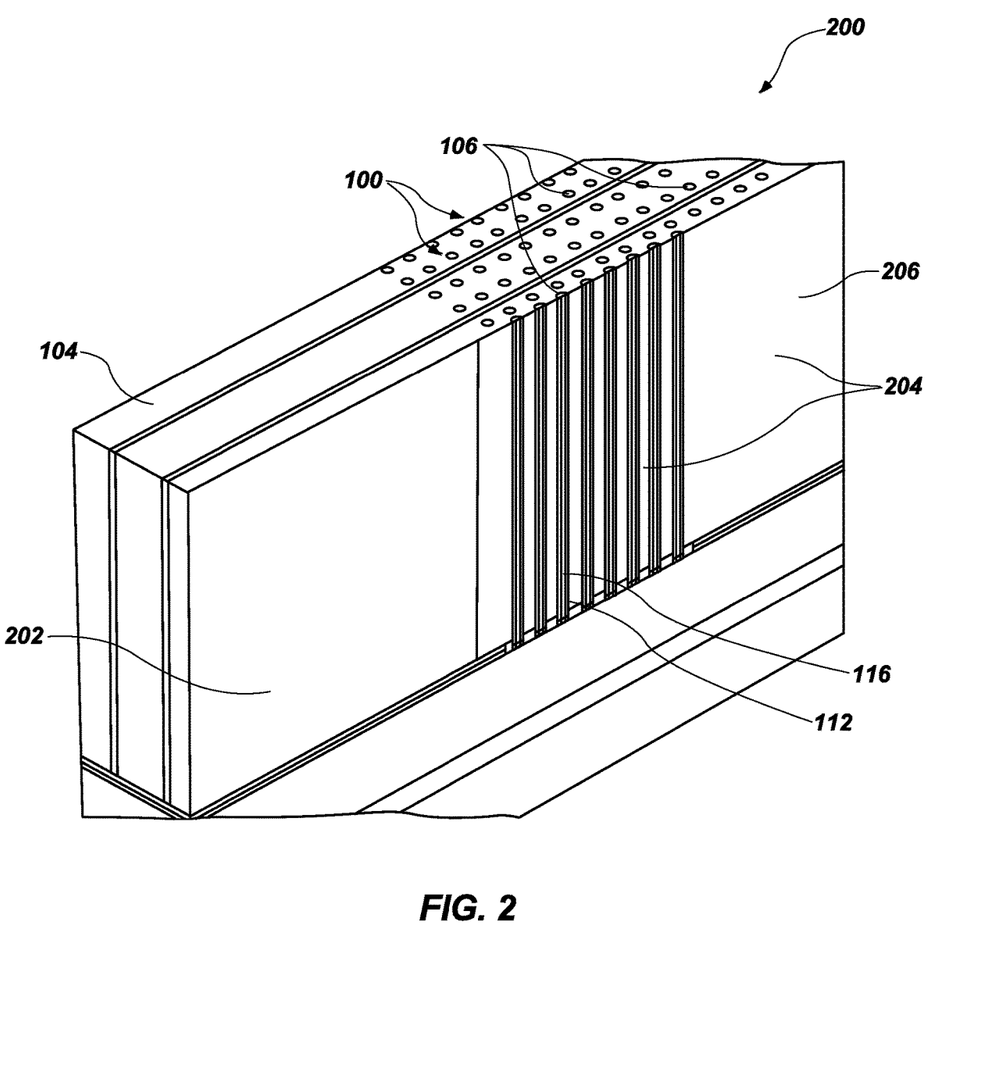
FIG. 2 is a perspective view of a microelectronic device including the contact structure, in accordance with embodiments of the disclosure.

Additional process stages may be conducted on the contact structure 100 to form a microelectronic device 200 (e.g., an apparatus) that includes one or more contact structures 100 and additional components, as shown in FIG. 2. The microelectronic device 200 includes an array region 202 (e.g., a memory array) and a staircase region 204. The array region 202 and staircase region 204 may be formed by conventional techniques. Tier dielectric materials 206 (e.g., dielectric stacks of at least two different alternating dielectric materials) may be located within the staircase region 204 and/or in the array region 202. The microelectronic device 200 according to embodiments of the disclosure may have any number of tiers, such as at least 16, 32, 36, or 72 tiers, by way of non-limiting examples. Memory cell pillars (not shown) may be located within the array region 202, and stair step structures (not shown for simplicity) may be located within the staircase region 204. Conductive vias, such as the openings 106 of the contact structure 100, may extend vertically through insulative materials (e.g., the insulating material 104 of the contact structure 100) within the microelectronic device 200. The openings 106 may include the conductive material 112 and the stress compensation material 116 therein, as well as the dielectric liner material 108, the barrier materials 110, 114, as previously described in reference to FIGS. 1A-1I. In some embodiments, the openings 106 may extend through a vertical extent of the microelectronic device 200 as so-called "through-array vias" or "TAVs." In other embodiments, the openings 106 may extend through only a portion of the vertical extent of the microelectronic device 200.

As shown in FIG. 2, the openings 106, including the conductive material 112 and the stress compensation material 116, may be located within or adjacent to the staircase region 204. In addition, at least some of the openings 106 may be located within or adjacent to the array region 202. In some embodiments, the array region 202 may be centrally located within the microelectronic device 200 with two staircase regions 204 located on opposing ends thereof. In such embodiments, the openings 106 may be located in the array region 202, at least one of the staircase regions 204, and/or within any regions located therebetween. Further, the conductive material 112 of the contact structure 100 may be electrically connected with conductive structures within the array region 202 and/or the staircase region 204. In some embodiments, the conductive material 112 may be electrically connected with other features or elements within the microelectronic device 200 external to the array region 202 and the staircase region 204. The conductive material 112 within the openings 106 may be electrically connected to sub-array circuitry, such as a driver circuit, in or on a substrate. For example, the conductive material 112 of at least one of the openings 106 may operatively couple the sub-array circuitry to the microelectronic device 200. The stress compensation material 116 within the openings 106 may support the alternating dielectric materials of the tier dielectric materials 206 during fabrication of the microelectronic device 200. Further, the stress compensation material 116 may improve structural properties within the microelectronic device 200. For example, the stress compensation material 116 may include one or more stress compensation interlayers (e.g., compressive materials) to tune compressive and/or tensile stresses within the staircase region 204 of the microelectronic device 200.

Accordingly, a microelectronic device comprising an array region and a staircase region adjacent the array region is disclosed. At least one of the array region and the staircase region comprises openings in an insulating material. Each of the openings in the insulating material comprises a dielectric liner material adjacent the insulating material, a conductive material adjacent the dielectric liner material, and a stress compensation material adjacent the conductive material and in a central portion of the at least one contact via. The stress compensation material is at least partially surrounded by the conductive material.

Figure 3:
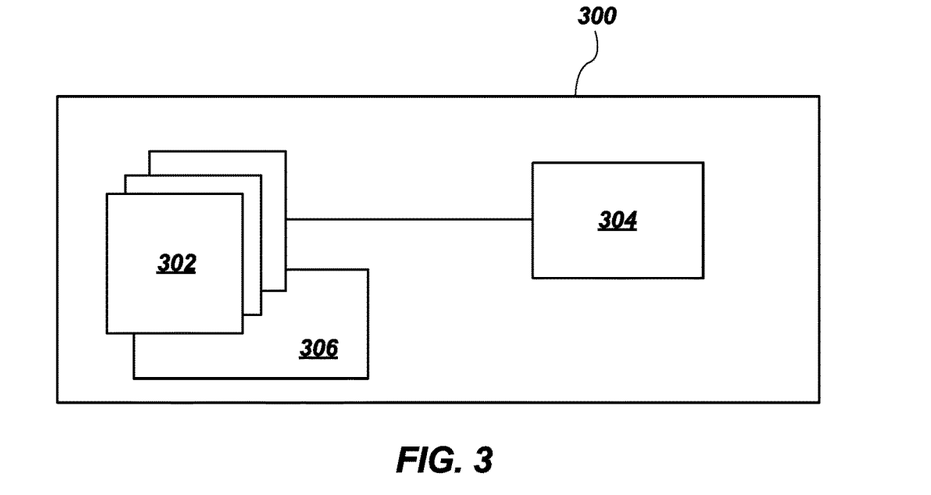
FIG. 3 is a schematic block diagram of a memory device, in accordance with embodiments of the disclosure.

The contact structure 100 according to embodiments of the disclosure may be used in a memory device 300 that includes one or more memory arrays 302 of memory cells. The memory device 300 (e.g., a DRAM device, a 3D NAND Flash memory device) is shown schematically in the functional block diagram of FIG. 3. The memory device 300 includes the memory arrays 302 of memory cells of one or more contact structures 100 and a control logic component 304. The control logic component 304 may be configured to operatively interact with the memory array 302 so as to read, write, or re-fresh any or all memory cells within the memory arrays 302. For example, the memory device 300 may include the memory arrays 302, which may include a complementary metal-oxide-semiconductor (CMOS) region, such as CMOS under array (CUA) region 306 underlying the memory arrays 302. The memory arrays 302 may include memory cells that are connected to access lines (e.g., word lines) and data lines (e.g., bit lines). Further, the CUA region 306 may underlie the memory arrays 302 and include support circuitry thereof. The support circuitry may support one or more additional arrays of memory cells present in a stacked configuration. For example, the memory device 300, including the memory array 302 having memory cells, can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. In a stacked configuration, the CUA region 306 may facilitate accessing one or more memory cells in each array. For example, the CUA region 306 may facilitate the transfer of data between a memory cell coupled to a channel of a memory array 302, a memory cell coupled to a channel of an additional memory array 302 that is coupled to memory array 302, and a controller.

Accordingly, a memory device comprises at least one contact via in an insulating material, a stress compensation material in a central portion of the at least one contact via, and a conductive material adjacent to the stress compensation material. The stress compensation material is configured to provide structural support along a height of the at least one contact via. The conductive material at least partially surrounds the stress compensation material.

Figure 4:
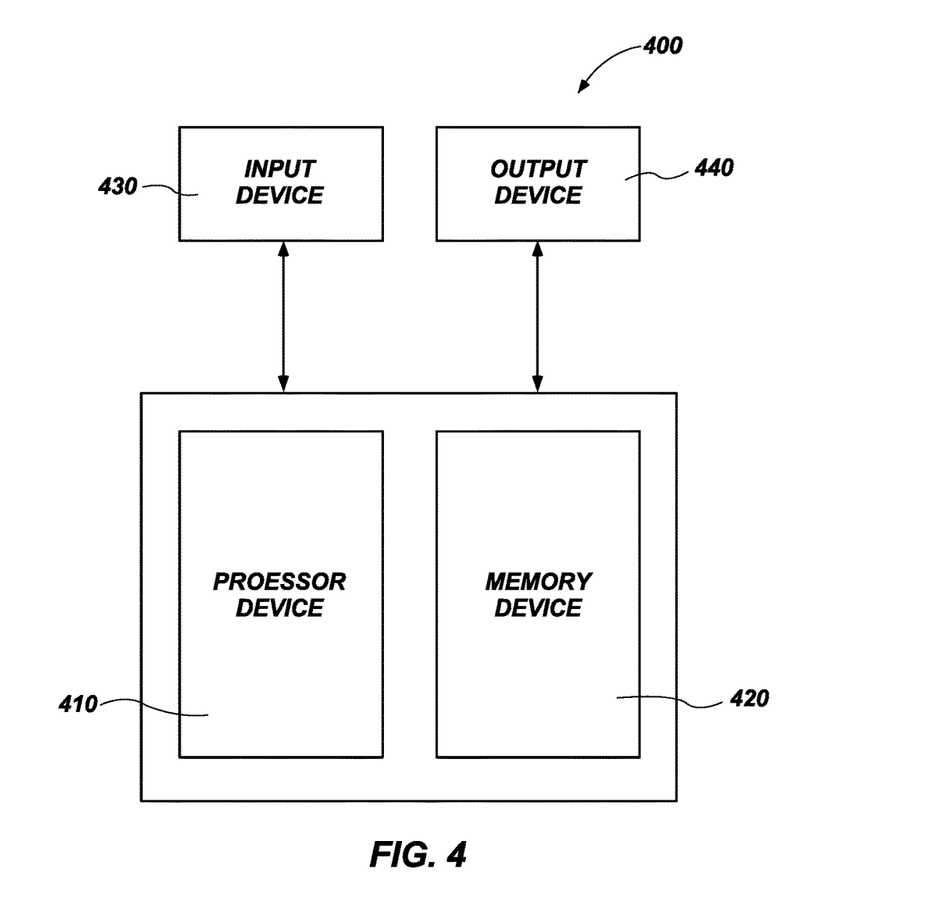
FIG. 4 is a schematic block diagram of an electronic system, in accordance with embodiments of the disclosure.

Microelectronic devices including device structures (e.g., the contact structure 100) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 400 includes at least one memory device 420. The memory device 420 may be included in, for example, an embodiment of a microelectronic device (e.g., microelectronic device 200 including one or more contact structures 100) previously described herein. The electronic system 400 may further include at least one electronic signal processor device 410 (often referred to as a "microprocessor"). The electronic signal processor device 410 may, optionally, include an embodiment of a microelectronic device previously described herein (e.g., the contact structure 100). The electronic system 400 may further include one or more input devices 430 for inputting information into the electronic system 400 by a user, such as, for example, a mouse or other pointing device, a keyboard, a touchpad, a button, or a control panel. The electronic system 400 may further include one or more output devices 440 for outputting information (e.g., visual or audio output) to a user such as, for example, a monitor, a display, a printer, an audio output jack, a speaker, etc. In some embodiments, the input device 430 and the output device 440 may comprise a single touchscreen device that can be used both to input information to the electronic system 400 and to output visual information to a user. The input device 430 and the output device 440 may communicate electrically with one or more of the memory device 420 and the electronic signal processor device 410.

Thus, an electronic system according to embodiments of the disclosure comprises an input device, an output device, a processor device operably coupled to the input device and the output device, and a memory device operably coupled to the processor device. The memory device comprises a contact via in one or more insulating materials, a conductive material within the contact via, and a stress compensation material laterally adjacent the conductive material in a central portion of the contact via. The stress compensation material may be at least substantially surrounded by the conductive material on at least three sides. The stress compensation material may be configured to reduce bow in a vertical direction of the contact via.

The following example serves to explain embodiments of the disclosure in more detail. This example is not to be construed as being exhaustive or exclusive as to the scope of this disclosure.

Example 1

Contact structures similar to that shown in FIG. 1F were prepared as described above for FIGS. 1A-1I. Samples of the contact structures included a conductive material (e.g., tungsten) in varying thicknesses and a stress compensation material within contact vias having a critical dimension of about 400 nm. The stress compensation material was formed in the central portion of the contact vias and the conductive material was formed surrounding the stress compensation material. Three (3) samples were prepared having differing thicknesses of tungsten as the conductive material. A first sample was prepared where the tungsten was formed at a thickness of about 500 Å, a second sample was prepared where the tungsten was formed at a thickness of about 1000

Å, and a third sample was prepared where the tungsten was formed at a thickness of about 1500 Å. Each of the three (3) samples included a stress compensation material (e.g., a high quality silicon oxide material, such as an ALD $SiO_x$) formed at a thickness of about 2500 Å. In addition, each of the three (3) samples included a barrier material formed at a thickness of about 50 Å. The barrier material was located external to the conductive material (e.g., between the conductive material and a dielectric liner material). A fourth sample of the contact structures was prepared including the stress compensation material formed at a thickness of about 2500 Å, without the conductive material.

For comparison, a control sample was prepared as described above except that a single conductive material (e.g., tungsten) was formed in the contact vias, without forming the stress compensation material in the central portion of the contact vias. Thus, no stress compensation material was present in the control sample.

Figure 5:
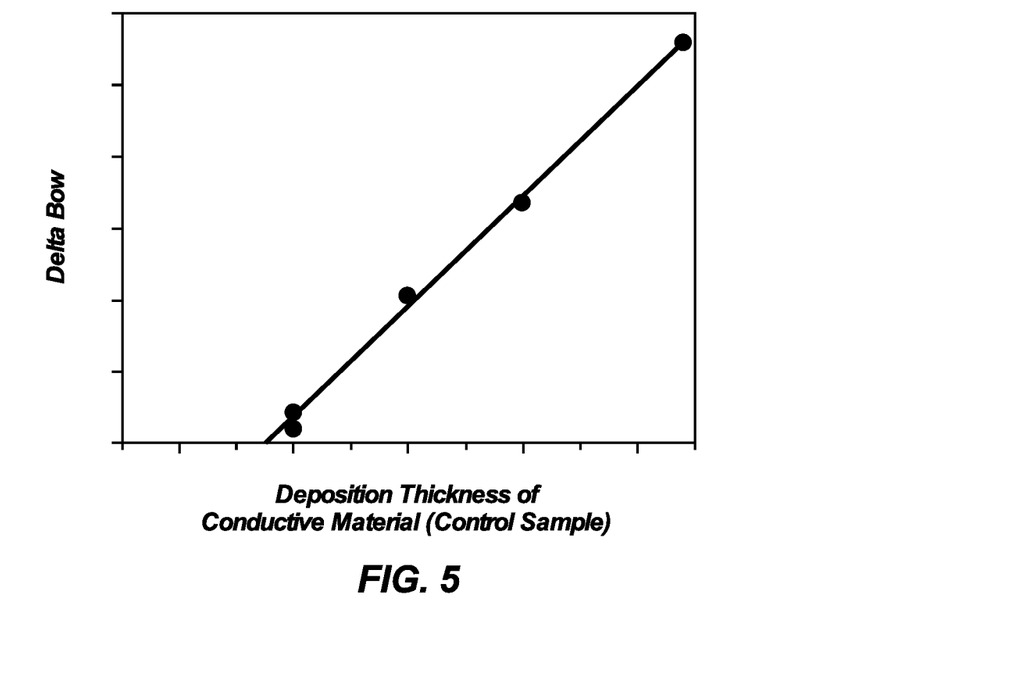
FIG. 5 is a plot of change in bow as a function of deposition thickness of a conductive material.
Figure 6:
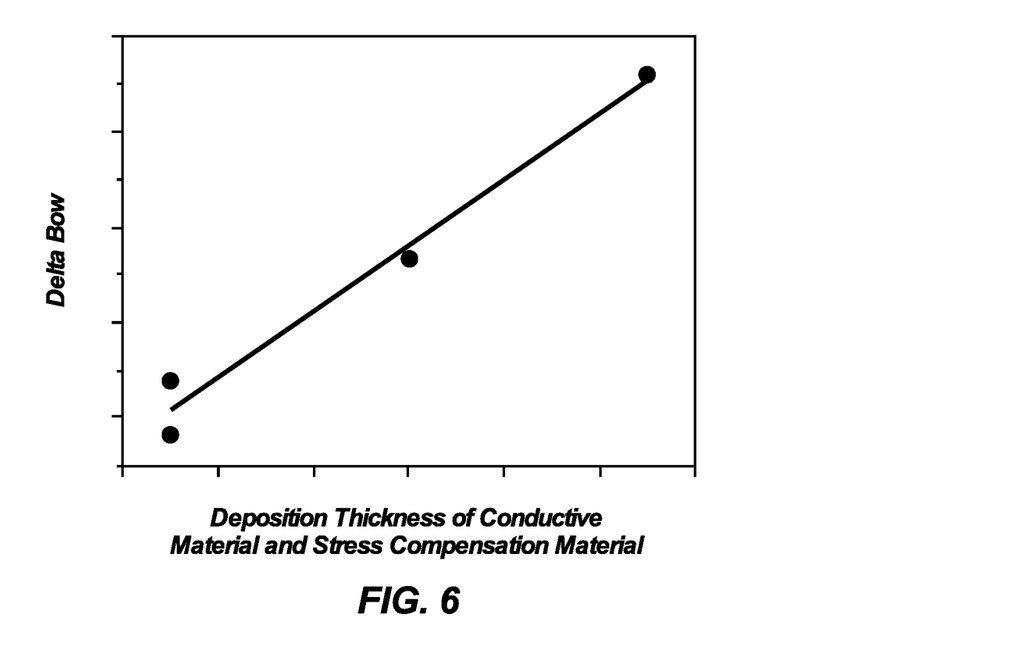
FIG. 6 is a plot of change in bow as a function of deposition thickness of a conductive material and a stress compensation material.

The structural properties of the samples were determined by conventional techniques. In particular, in-line bow measurements were obtained to determine relative amounts of bow observed in the samples. It was determined that delta bow (e.g., a change in bow) increased linearly with the amount of tungsten deposited. As shown in FIG. 5, delta bow as a function of deposition thickness of the tungsten illustrated the bow increased linearly with the deposition amount of the tungsten (alone) of the control sample. In particular, it was determined for the control sample that about 6.3 μm of bow occurred for each 100 Å of tungsten deposited. As shown in FIG. 6, delta bow as a function of deposition thickness of the tungsten also increased linearly with the deposition amount of the tungsten of the three (3) samples including the stress compensation material. In contrast to the control sample, however, it was determined that for the three (3) samples including the stress compensation material, about 1.7 μm of bow occurred for each 100 Å of tungsten deposited. In other words, delta bow as a function of deposition thickness of the tungsten alone resulted in a linear response in the control sample, but the slope of the line was relatively less for the three (3) samples including the tungsten and the stress compensation material than the slope of the line for the control sample including the tungsten material alone. Thus, the stress compensation material exhibiting a relatively high compressive stress was found to balance (e.g., offset) the relatively high tensile stress properties of the tungsten to reduce distortion (e.g., bowing) within the apparatus. These results were unexpected. Therefore, it was determined that including the stress compensation material adjacent to the tungsten (e.g., in the central portion of the openings) resulted in improved structural performance by increasing stress compensation using the stress compensation material as compared to filling the contact vias with the tungsten alone.

The methods, apparatuses, devices (e.g., memory devices), and electronic systems of the disclosure may facilitate one or more of increased performance, increased efficiency, increased reliability, and increased durability as compared to conventional methods, conventional apparatuses, conventional devices, and conventional electronic systems.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. An apparatus, comprising:
   at least one contact structure, comprising:
      a contact;
      an insulating material overlying the contact;
      at least one contact via in the insulating material;
      a dielectric liner material adjacent the insulating material within the at least one contact via;
      a conductive material adjacent the dielectric liner material; and
      a stress compensation material adjacent the conductive material and in a central portion of the at least one contact via, the stress compensation material at least partially surrounded by the conductive material.

2. The apparatus of claim 1, wherein the conductive material is in electrical contact with the contact, the conductive material comprising a metal nitride material or a tungsten material.

3. The apparatus of claim 1, wherein at least one of the dielectric liner material and the stress compensation material comprises a conformal silicon oxide material, the stress compensation material located distal to the dielectric liner material.

4. The apparatus of claim 1, wherein the stress compensation material extends vertically within the at least one contact via with a lower end of the stress compensation material located below an upper surface of the insulating material and an upper end of the stress compensation material being substantially coplanar with an upper surface of the dielectric liner material.

5. The apparatus of claim 1, wherein the stress compensation material is directly adjacent sidewalls of the conductive material, the stress compensation material substantially completely filling the central portion of the at least one contact via.

6. The apparatus of claim 1, wherein the conductive material surrounding the stress compensation material comprises a substantially uniform thickness around a perimeter thereof.

7. The apparatus of claim 1, wherein the stress compensation material comprises a compressive material having a higher compressive stress than the conductive material.

8. The apparatus of claim 1, wherein a thickness of the stress compensation material is greater than a thickness of the dielectric liner material.

9. The apparatus of claim 1, further comprising at least one of a first barrier material between the dielectric liner material and the conductive material and a second barrier material between the conductive material and the stress compensation material, wherein a thickness of each of the first barrier material and the second barrier material is less than a thickness of each of the stress compensation material and the dielectric liner material.

10. A method of forming an apparatus, comprising:
   forming a dielectric liner material adjacent to an insulating material within at least one contact via in the insulating material;
   forming a barrier material adjacent to the dielectric liner material;
   forming a conductive material adjacent to the barrier material and the dielectric liner material, the conductive material in electrical contact with a contact of at least one contact structure underlying the insulating material; and forming a stress compensation material in a central portion of the at least one contact via and adjacent to the conductive material, the stress compensation material at least partially surrounded by the conductive material and configured to reduce bow in a vertical direction of the conductive material.

11. The method of claim 10, further comprising removing portions of each of the barrier material, the conductive material, and the stress compensation material overlying the insulating material and the dielectric liner material external to the at least one contact via.

12. The method of claim 11, further comprising forming an upper conductive structure overlying exposed upper surfaces of each of the conductive material and the stress compensation material, wherein the upper conductive structure comprises at least one of a metal, an alloy, a conductive metal oxide, a conductive metal nitride, a conductive metal silicide, and a conductively doped semiconductor material.

13. The method of claim 10, wherein forming the stress compensation material comprises forming the stress compensation material within the at least one contact via having an aspect ratio of between about 20:1 and about 40:1.

14. The method of claim 10, wherein:
forming the dielectric liner material comprises forming a conformal silicon oxide material using a first conformal deposition process;
forming the barrier material comprises forming a titanium nitride material using a second conformal deposition process;
forming the conductive material comprises forming a metal nitride material or a tungsten material using a third conformal deposition process; and
forming the stress compensation material comprises forming a compressive dielectric material using a nonconformal deposition process.

15. The method of claim 10, wherein forming the stress compensation material comprises forming a cap material overlying at least one air gap.

16. The method of claim 10, wherein forming the stress compensation material comprises forming the stress compensation material at a thickness of between about 2000 Å and about 3000 Å within the central portion of the at least one contact via, the stress compensation material substantially completely filling the central portion of the at least one contact via.

17. A memory device, comprising:
at least one contact via of a contact structure in an insulating material;
a stress compensation material in a central portion of the at least one contact via, the stress compensation material configured to provide structural support along a height of the at least one contact via; and
a conductive material adjacent to the stress compensation material, the conductive material at least partially surrounding the stress compensation material.

18. The memory device of claim 17, wherein:
the stress compensation material comprises an oxide, a nitride, or an oxynitride, and a lower end of the stress compensation material is located below than an upper surface of the insulating material; and
the conductive material comprises titanium nitride or tungsten, the conductive material substantially surrounding the stress compensation material on at least three sides.

19. The memory device of claim 17, further comprising trenches extending horizontally between the at least one contact via, wherein at least some of the trenches comprise the stress compensation material in a central portion of the trenches and the conductive material located adjacent to and at least partially surrounding the stress compensation material within the trenches.

20. The memory device of claim 17, further comprising an array region and a staircase region, the at least one contact via extending through tiers of alternating dielectric materials within the staircase region.

21. The memory device of claim 17, further comprising at least one memory array of memory cells and including a CMOS under array (CUA) region under the at least one memory array, wherein the conductive material is connected to individual memory cells of the at least one memory array and to circuitry of the CUA region.

22. The memory device of claim 21, wherein the at least one memory array is a three-dimensional memory array of a 3D NAND Flash memory device including the CUA region directly underlying the three-dimensional memory array.

23. An electronic system, comprising:
an input device;
an output device;
a processor device operably coupled to the input device and the output device; and
a memory device operably coupled to the processor device, the memory device comprising:
a through-array via in one or more insulating materials;
a conductive material within the through-array via; and
a stress compensation material laterally adjacent the conductive material in a central portion of the through-array via, wherein the stress compensation material is at least substantially surrounded by the conductive material on at least three sides, the stress compensation material being configured to reduce bow in a vertical direction of the through-array via.

* * * * *

UNITED STATES PATENT AND TRADEMARK OFFICE
CERTIFICATE OF CORRECTION

PATENT NO. : 11,342,265 B2  
APPLICATION NO. : 16/702222  
DATED : May 24, 2022  
INVENTOR(S) : Greenlee et al.

Page 1 of 1

It is certified that error appears in the above-identified patent and that said Letters Patent is hereby corrected as shown below:

In the Specification

Column 5, Line 42, change "("SOT")" to --("SOI")--

Signed and Sealed this  
Thirteenth Day of September, 2022

Katherine Kelly Vidal  
*Director of the United States Patent and Trademark Office*